(12) United States Patent
Kinoshita

(10) Patent No.: US 6,286,424 B1
(45) Date of Patent: Sep. 11, 2001

(54) PLASTIC MASK UNIT FOR PASTE PRINTING AND METHOD OF FABRICATING SUCH PLASTIC MASK UNIT

(75) Inventor: Makoto Kinoshita, Tottori-ken (JP)

(73) Assignee: Ricoh Microelectronics Co.,, Tottori (JP)

( * ) Notice: Subject to any disclaimer, the term of this patent is extended or adjusted under 35 U.S.C. 154(b) by 0 days.

(21) Appl. No.: 08/770,256

(22) Filed: Dec. 20, 1996

(30) Foreign Application Priority Data

Dec. 21, 1995 (JP) .................................................. 7-333185

(51) Int. Cl.[7] ........................................................ B41M 1/12
(52) U.S. Cl. ........................ 101/129; 101/128.1; 101/127
(58) Field of Search ...................... 101/127, 127.1, 101/128.1, 128.21, 129, 401.1, 483, 128.4; 228/39; 118/213, 301, 406; 29/840, 841, 846, 850; 347/47

(56) References Cited

U.S. PATENT DOCUMENTS

| | | | | |
|---|---|---|---|---|
| 3,435,758 | * | 4/1969 | Brennan et al. .................... | 101/127.1 |
| 3,668,028 | * | 6/1972 | Short ................................. | 101/128.4 |
| 3,934,503 | * | 1/1976 | Kinney et al. ..................... | 101/128.4 |
| 4,132,168 | * | 1/1979 | Peterson ............................ | 101/401.1 |
| 4,702,783 | * | 10/1987 | Mason, III ........................ | 101/128.4 |
| 4,791,006 | * | 12/1988 | Galvagni .............................. | 101/129 |
| 4,802,945 | * | 2/1989 | Opina .................................... | 156/247 |
| 5,003,870 | * | 4/1991 | Isaak .................................. | 101/127.1 |
| 5,054,391 | * | 10/1991 | Tanaka et al. ..................... | 101/128.1 |
| 5,058,499 | * | 10/1991 | Christman ......................... | 101/127.1 |
| 5,285,725 | * | 2/1994 | Imakai et al. .................... | 101/128.21 |
| 5,294,567 | * | 3/1994 | Durfman et al. ..................... | 437/187 |
| 5,314,709 | * | 5/1994 | Doany et al. ......................... | 156/643 |
| 5,347,925 | * | 9/1994 | Holderegger ...................... | 101/128.1 |
| 5,359,928 | * | 11/1994 | Blessington et al. ............. | 101/128.4 |
| 5,373,627 | * | 12/1994 | Grebe ..................................... | 29/841 |
| 5,389,954 | * | 2/1995 | Inaba et al. ............................ | 347/47 |
| 5,460,921 | * | 10/1995 | Cywar et al. ........................ | 430/314 |
| 5,483,883 | * | 1/1996 | Hayama .......................... | 101/128.21 |
| 5,588,359 | * | 12/1996 | Hofmann et al. ................ | 101/128.21 |
| 5,593,080 | * | 1/1997 | Teshima et al. ..................... | 101/127 |
| 5,669,970 | * | 9/1997 | Balog et al. ..................... | 101/127.1 |
| 5,703,631 | * | 12/1997 | Hayes et al. .......................... | 347/47 |
| 5,728,244 | * | 3/1998 | Nanataki et al. ..................... | 156/89 |
| 5,948,466 | * | 9/1999 | Sarashina et al. ..................... | 427/97 |
| 5,972,482 | * | 10/1999 | Hatakeyama et al. ............... | 428/209 |
| 5,976,393 | * | 11/1999 | Abe ........................................ | 216/18 |

FOREIGN PATENT DOCUMENTS

| | | | | |
|---|---|---|---|---|
| 0229595 | * | 10/1986 | (JP) ................................. | 101/128.4 |
| 2001589 | * | 1/1987 | (JP) ................................. | 101/128.4 |
| 401255536A | * | 10/1989 | (JP) ................................. | 101/128.4 |

\* cited by examiner

Primary Examiner—Eugene Eickholt
(74) Attorney, Agent, or Firm—Oblon, Spivak, McClelland, Maier, Neustadt, P.C.

(57) ABSTRACT

A plastic mask unit for paste printing, which is capable of performing paste printing with superior quality for a relatively large number of times over a long life span, and also a method of fabricating the above-mentioned plastic mask unit. The plastic mask unit includes a mask frame and a plastic mask plate which is secured directly to the mask frame. The plastic mask plate can be formed with a plurality of slit-shaped through-holes for serving as a print pattern for paste printing, either before or after the plastic mask plate is secured directly to the mask frame.

20 Claims, 5 Drawing Sheets

PLASTIC MASK UNIT FOR PASTE PRINTING AND METHOD OF FABRICATING SUCH PLASTIC MASK UNIT

BACKGROUND OF THE INVENTION

1. Field of the Invention

This invention relates to a mask unit for paste printing for forming patterns by use of an ink, an adhesive, solder paste, or a paste-like resin on a printing material, and more particularly to a plastic mask unit which has a long life and is capable of performing paste printing of a superior quality.

This invention also relates to a method of fabricating the above-mentioned plastic mask unit.

2. Discussion of the Background

In the field of paste printing, several different types of conventional masks have been put in practice for forming printed patterns on a printing material by use of various pastes, such as, solder paste, an ink, an adhesive agent, and a paste resin (hereinafter referred to as the paste). An example of conventional printing masks for the paste printing is a mask known as a punch press mask which can be prepared by forming round through-holes in a metal sheet with a punch. Another example is a YAG laser mask which can be prepared by forming through-holes in a metal sheet with a YAG laser. Another example is an etching mask which can be prepared by forming through-holes in a metal sheet using a metal etching process. Still another example is an additive mask which can be prepared by forming through-holes in a metal plate formed by being plated around a pattern of through-holes.

In addition to the above-mentioned metal masks, a mask made of a plastic sheet has been recently introduced which is disclosed in the official gazette for Japanese Laid Open Patent Application TOKUKAI HEI 7-81027. This plastic mask can be prepared by forming slit-shaped through-holes in a plastic sheet by excimer laser abrasion. As a result, the plastic mask becomes free from various known shortcomings, such as, for example, burr in the edges of the through-holes, deposition of dross in the through-holes, and so forth, that occur in the conventional metal masks. Also, such a plastic mask meets increasing demands for highly precise paste printing of a micro pattern with high quality, which arise from the recent trend whereby electronic appliances and parts are made smaller and smaller in size.

In these conventional masks, a metal sheet or a plastic sheet is secured to a mask frame with a mesh screen inserted in between. A fabrication procedure for these conventional masks is now explained with reference to FIGS. 10(a)–10(h).

In FIG. 10(a), reference numeral 301 denotes a mask frame to which a rectangular cross section aluminum pipe is commonly adopted. Such an aluminum mask frame is coated with a coating agent suitable for gluing aluminum so that a first thin film 302 suitable for gluing aluminum is formed in a square frame on the edge of the mask frame 301 as shown in FIG. 10(a). A rubber adhesive diluted with a diluent is commonly applied to this coating material. A rough finish may be provided to the edge of the mask frame 301 before the first thin film 302 is formed thereon.

In a similar manner, a mesh screen 303 is coated with a coating material suitable for gluing polyester, for example, so that a second thin film suitable for gluing polyester is formed in a square frame on the mesh screen 303. For the mesh screen 303, either a polyester mesh screen of about 180 to 225 mesh or a nylon mesh screen of about 180 to 225 mesh can be applied.

Next, a step of gluing the polyester mesh screen 303 to the mask frame 301 is illustrated in FIG. 10(b). An example of an adhesive is an epoxy type adhesive which is suitable for gluing both the first thin film formed on the mask frame 301 and the second thin film formed on the polyester mesh screen 303. Such an epoxy adhesive is coated on either one or both of the first thin film formed on the mask frame 301 and the second thin film formed on the polyester mesh screen 303. After that, the polyester mesh screen 303 is affixed to the mask frame 301 with the application of a predetermined tension thereto in the directions as indicated by arrows in FIG. 10(b).

As a result, the mesh screen 303 is secured to the mask frame 301 as shown in FIG. 10(c). Since, in addition to extension caused by the predetermined tension, the mesh screen 303 is prepared in a predetermined size larger than the mask frame 301, there are overhanging edges 303a of the mesh screen relative to the periphery of the mask frame 301 as shown in FIG. 10(c). Accordingly, these overhanging edges 303a of the mesh screen 303 are cut off so that the mesh screen 303 becomes equal in size to the mask frame 301 in the horizontal plain in the drawing.

Next, a step of drawing register marks for accurately registering the mesh screen relative to the mask plate is shown in FIG. 10(d). A register mark 303b is drawn at the centers of all four sides of the mesh screen 303 secured to the mask frame 301. The register marks 303b are drawn softly and visibly using a sharp-pointed pencil on the mesh screen 303 so that the mask plate 304 can be accurately registered relative to the mesh screen 303 in the following step.

The mask plate 304 is then coated with a coating agent as shown in FIG. 10(e). This mask plate 304 includes a number of slit-shaped through-holes for serving as a print pattern for paste printing. The edge of the mask plate 104 is coated with a coating agent suitable for gluing the mask plate 304. As a result, a thin film 304b suitable for gluing the mask plate 304 is formed. Then, the mask plate 304 is secured to the mesh screen 303. In this event, a rubber type adhesive diluted with a diluent is usually applied to the coating agent. In addition, the edge frame of the mesh screen 303 may be coated with another coating agent suitable for gluing polyester, for example, so that a polyester thin film suitable for gluing polyester can be formed on the edge frame of the mesh screen 303. Moreover, a rough finish or a number of fine holes may be provided at the edge of the mask plate 304 before the thin film 304b is formed. thereon.

Next, the step of securing the mask plate 304 to the mesh screen 303 on the mask frame 301 is shown in FIG. 10(f). In this step, the position of the mask plate 304 on the mesh screen 303 is manually adjusted so that center holes 304c on each side of the mask plate 304 and the register marks 303b of the mesh screen 303 can be finely registered. Then, the mask plate 304 is temporarily taped to the mask frame 301 and the mesh screen 303 to form an integrated unit. After that, this one unit of the mask frame 301, the mesh screen 303, and the mask plate 304 is turned upside down and masking tape is placed over a relatively large area of the mesh screen 303, leaving an area in the form of a square frame to be coated with adhesive, while the taped area is not coated with the adhesive. This masking tape must be in place before an epoxy type adhesive, for example, is coated onto the square frame of the mesh screen 303. The masking tape is removed after the adhesive is cured on the mesh screen 303.

The step of making an opening 303c is explained in FIG. 10(g). The opening 303c is formed by cutting out the mesh screen 303. The area cut must not be secured by the mask plate 304 so that a portion 305 in which the adhesive is cured on the mesh screen 303 can be left. After that, each glued portion is provided with guard tapes to prevent peeling-off so that the mask frame 301 and the mesh screen 303, the mask plate 304 and the mesh screen 303 are mutually secured.

In this way, the conventional mask unit for paste printing is fabricated. Consequently, the thus fabricated printing mask unit has a three-layer structure wherein the mask frame 301 and the mask plate 304 are secured with the mesh screen 303 inserted in between, as shown in FIGS. 10(g) and 10(h).

However, there has been a problem in which registration of through-holes relative to the printing material becomes inaccurate in the case where a plastic sheet is applied to the mask plate during the above-mentioned fabrication procedure of the mask unit for paste printing. This is because of the tension, which is applied to the mesh screen secured to the mask frame, for holding the mask plate at a relatively high degree of flatness when the mask plate is secured to the mask frame. Accordingly, when a plastic sheet is used as the mask plate, this plastic mask plate may be overstretched by the above-mentioned tension and thereby registration of through-holes relative to the printing material may deteriorate.

There has been another problem in the above-mentioned conventional mask unit for paste printing in which the life of the mask unit becomes relatively short. This is because two secured portions of the conventional mask unit, one between the mask frame and the mesh screen and the other between the mask plate and the mesh screen, are breakable and apt to be peeled off when the mask unit is subjected to washing for a number of times to protect the through-holes from being filled with paste material. In this case, if the secured portions are peeled off, the mask plate loses tension so that the position of the through-holes relative to the printing material is displaced, resulting in deterioration of print quality.

Further, there has been another problem in the conventional mask unit for paste printing and its fabrication procedure. This is an increase in fabrication steps, such as, for example, the step of placing a masking tape on the mesh screen, the step of cutting off the mesh screen, and so forth.

Further, there has been another problem in the conventional mask unit for paste printing and its fabrication procedure. This is the problem of displacement of the mask plate relative to the mask frame. This is because the steps for securing the elements are separated into one step for the mask frame and the mesh screen and another step for the mask plate and the mesh screen. The resultant displacement causes inaccurate registration of the through-holes of the mask plate relative to the printing material, leading to a deterioration of print quality. Moreover, owing to this problem, there has been another problem in which fine adjustment of the position of the mask plate is required during installation of the mask unit on a paste printing machine.

SUMMARY OF THE INVENTION

Accordingly, an object of the present invention is to provide a novel plastic mask unit for paste printing which is superior in accurate registration of a print pattern thereof relative to a printing material and capable of performing paste printing with superior printing quality.

Another object of the present invention is to provide a novel plastic mask unit for paste printing which has a relatively long life and is therefore capable of performing paste printing for a relatively large number of times.

Another object of the present invention is to provide a novel plastic mask unit for paste printing which is fabricated in a relatively small number of fabrication steps.

Another object of the present invention is to provide a novel plastic mask unit for paste printing which is installed in a relatively small number of installation steps on a paste printing machine.

Another object of the present invention is to provide a method of fabricating the above-mentioned novel plastic mask unit for paste printing.

The above objects of the present invention can be achieved by the following plastic mask unit for paste printing and the fabrication methods, therefore:

A mask unit for paste printing according to the present invention is a plastic mask unit which includes a mask frame and a mask plate including a plastic sheet formed with a plurality of slit-shaped through-holes therein for serving as a print pattern for paste printing, and wherein the mask plate is secured directly to the mask frame.

In the above-mentioned plastic mask unit, the mask plate is secured directly to the mask frame with at least one adhesive.

The above-mentioned adhesive includes three adhesive layers, a first adhesive layer which is suitable for adhering to the mask frame and placed on the mask frame side, a third adhesive layer which is suitable for adhering to the mask plate and placed on the mask plate side, and a second adhesive layer which is suitable for adhering to the first and third layers and placed between the first and third layers.

Further, the above-mentioned mask frame is secured to a first adhesive thin film suitable for adhering the mask frame, the mask plate is secured to a second adhesive thin film suitable for adhering to the mask plate, and the mask frame and the mask plate are secured together by an adhesive suitable for adhering to the first and second adhesive thin films.

Furthermore, the above-mentioned mask plate includes a plastic sheet which is formed with a plurality of slit-shaped through-holes for serving as a print pattern for paste printing by using an excimer laser.

A method of fabricating a plastic mask unit, which includes a mask frame and a mask plate including a plastic sheet, for paste printing, according to the present invention, includes steps of forming the mask plate with a plurality of slit-shaped through-holes for serving as a print pattern for paste printing and securing the mask plate directly to the mask frame.

In the above-mentioned plastic mask unit fabrication method, the step of securing the mask plate including steps of coating a first adhesive suitable for adhering to the mask frame on the surface of the mask frame, coating a second adhesive suitable for adhering to the mask plate on the surface of the mask plate, and then securing the mask plate directly to the mask frame by a third adhesive suitable for adhering to the first and second adhesives.

Further, the above-mentioned step of securing the mask plate directly to the mask frame comprising steps of securing the mask frame to a first adhesive thin film suitable for adhering to the mask frame, securing the mask plate to a second adhesive thin film suitable for adhering to the mask plate, and then securing the mask plate directly to the mask frame with an adhesive suitable for adhering to the first and second adhesive thin films.

Furthermore, in the above-mentioned plastic mask unit fabrication method, the step of forming the mask is carried out by using an excimer laser.

A method of fabricating a plastic mask unit, which includes a mask frame and a mask plate including a plastic sheet, for paste printing, according to the present invention, includes steps of securing the mask plate directly to the mask frame and forming the mask plate with a plurality of slit-shaped through-holes for serving as a print pattern for paste printing.

In the above-mentioned plastic mask unit fabrication method, the step of securing the mask plate directly to the mask frame including steps of coating a first adhesive, suitable for adhering to the mask frame, on the surface of the mask frame, coating a second adhesive, suitable for adhering to the mask plate, on the surface of the mask plate, and then securing the mask plate directly to the mask frame by a third adhesive suitable for adhering to the first and second adhesives.

Further, the above-mentioned step of securing the mask plate directly to the mask frame including steps of securing the mask frame to a first adhesive thin film suitable for adhering to the mask frame, securing the mask plate to a second adhesive thin film suitable for adhering to the mask plate, and then securing the mask plate directly to the mask frame with an adhesive suitable for adhering to the first and second adhesive thin films.

Furthermore, in the above-mentioned plastic mask unit fabrication method, the step of forming the mask is carried out by using an excimer laser.

A plastic mask unit for paste printing according to the present invention includes a mask frame and a mask plate which includes a plastic sheet formed with no through-holes therein and is secured directly to the mask frame.

In the above-mentioned plastic mask unit, the mask plate is secured directly to the mask frame with at least one adhesive.

Further, the above-mentioned adhesive includes three adhesive layers, a first adhesive layer which is suitable for adhering to the mask frame and placed on the mask frame side, a third adhesive layer which is suitable for adhering to the mask plate and placed on the mask plate side, and a second adhesive layer which is suitable for adhering to the first and third layers.

Furthermore, in the above-mentioned plastic mask unit fabrication method, the mask frame is secured to a first adhesive thin film suitable for adhering to the mask frame, the mask plate is secured to a second adhesive thin film suitable for adhering to the mask plate, and the mask frame and the mask plate are secured together by an adhesive suitable for adhering to the first and second adhesive thin films.

As a feature of a plastic mask unit for paste printing according to the present invention, the plastic mask unit for paste printing can be made superior in accurate registration of slit-shaped through-holes thereof relative to a printing material and therefore capable of performing the paste printing with superior printing quality. This is due to an arrangement in which a plastic mask plate including a plurality of slit-shaped through-holes therein is secured directly to a mask frame. Such an arrangement subsequently provides an effect whereby the plastic mask plate can be kept in a plane shape by its own elasticity even with less tension provided from the outside, in comparison with the case of using a mesh screen. Accordingly, such tension provided from the outside to the plastic mask plate can be reduced and, subsequently, the amount of extension of the plastic mask plate can be reduced. Thereby the plastic mask unit can improve the printing quality in the manner mentioned above.

Moreover, the plastic mask plate can be set in relatively close contact relative to the printing material, with the tension provided from the outside being reduced. Thereby, the plastic mask unit can perform fine paste printing in which less blurs occur.

As another feature of the above-mentioned plastic mask unit for paste printing according to the present invention, the plastic mask unit is free from displacement of the slit-shaped through-holes relative to the printing material. Accordingly, the plastic mask unit for paste printing according to the present invention provides superior accuracy in the registration of slit-shaped through-holes relative to the printing material and, subsequently, becomes capable of performing paste printing with superior printing quality.

This is due to an arrangement in which the number of mating faces of structural elements of the plastic mask unit is reduced so that the conventional mesh screen is eliminated and only a plastic mask plate and a mask frame are required. Accordingly, damage to the plastic mask unit due to peeling of the mating faces is rarely caused even when the plastic mask unit is subjected to a relatively large number of washes for protecting the through-holes from being filled with paste material or the like.

More specifically, in the plastic mask unit according to the present invention, the mating faces of the plastic mask plate and the mask frame can be made in a relatively large size, approximately 40 mm in width, for example, while those of the conventional mask unit can be made approximately 10 mm to 15 mm in width, for example. The capability of making such large-sized mating faces also supports the above-mentioned explanation that damage to the plastic mask unit due to peeling of the mating faces is rarely caused. Accordingly, the plastic mask unit according to the present invention becomes capable of performing paste printing with superior printing quality. Moreover, the plastic mask unit according to the present invention can be used for a relatively large number of times over a relatively long life span without damage from peeling of the mating faces.

As a feature of a method of fabricating the plastic mask unit for paste printing according to the present invention, a method of fabricating the plastic mask unit for paste printing can reduce the number of fabrication steps in comparison with the number of fabrication steps for the conventional mask unit. This is due to an arrangement whereby a mask plate is secured directly to a mask frame and a mesh screen is eliminated from the structural elements of the conventional mask unit. Accordingly, various fabrication steps, such as, for example, the step of securing the mesh screen to the mask frame, the step of securing the mask plate to the mesh screen, the step of cutting out a middle portion of the mesh screen, the step of securing a protective tape on mating portions of the mesh screen and the mask plate, and so forth, are eliminated. Moreover, the above-mentioned method of fabricating the plastic mask unit for paste printing can reduce the fabrication cost in view of not only fabrication hours but also elimination of parts.

Specifically, in the above-mentioned plastic mask unit fabricating method, there are preferable methods for securing the plastic mask plate, formed with a plurality of slit-shaped through-holes therein for serving as a print pattern for paste printing, directly to the mask frame. As an example, it is preferable to use an adhesive which is suitable for adhering to both of the materials of the plastic mask plate and the mask frame. As another example, it is also preferable to coat an adhesive suitable for adhering to materials of the mask frame on the mask frame side, to coat an adhesive suitable for adhering to materials of the plastic mask frame on the plastic mask plate side, and, then, to secure the mask frame and the plastic mask plate by an adhesive suitable for adhering to both of the materials of the plastic mask plate and the mask frame. As another example, it is also preferable to form a thin film suitable for adhering to the mask frame on a face to which the plastic mask plate is secured, to form a thin film suitable for adhering to the plastic mask plate on a face to which the mask frame is secured, and, then, to secure the mask frame and the plastic mask plate by an adhesive suitable for adhering to both of the thin films.

Moreover, in the above-mentioned preferable methods for securing the plastic mask plate directly to the mask frame, the mask frame and the plastic mask plate can be tightly secured by providing a rough finish on the surfaces of either or both of the mask frame and the plastic mask plate, or by forming a relatively large number of fine holes in the surface of the plastic mask plate.

As another feature of the method of fabricating the plastic mask unit for paste printing according to the present invention, the method of fabricating the plastic mask unit for paste printing can eliminate displacement of a print pattern including a plurality of slit-shaped through-holes relative to the printing material. Accordingly, this method of fabricating the plastic mask unit can provide a plastic mask unit which is capable of performing paste printing with superior quality. This is due to an arrangement whereby a plastic mask unit is subjected to a fabrication step of forming a plastic mask plate with a plurality of slit-shaped through-holes for serving as a print pattern for paste printing after the plastic mask unit has been fabricated in a semifinished form by securing the plastic mask plate directly to the mask frame without the forming process. Since the print pattern for paste printing is formed directly on the plastic mask unit, displacement is minimized in comparison with the case of the conventional mask unit for which the print pattern is formed on the mask plate before the mask plate is secured to the mask frame. Accordingly, the plastic mask unit fabricated by the above-mentioned method can perform fine paste printing with superior quality. Moreover, in such plastic mask unit fabricated by the above-mentioned method, steps of adjusting the position of the plastic mask unit in the paste printing machine can be eliminated.

Specifically, in the above-mentioned plastic mask unit fabricating method, there are preferable methods for securing the plastic mask plate, formed with no print pattern, directly to the mask frame. As an example, it is preferable to use an adhesive which is suitable for adhering to both the materials of the plastic mask plate and the mask frame. As another example, it is also preferable to coat an adhesive suitable for adhering to materials of the mask frame onto the mask frame side, to coat an adhesive suitable for adhering to materials of the plastic mask frame onto the plastic mask plate side, and, then, to secure the mask frame and the plastic mask plate by an adhesive suitable for adhering to both the materials of the plastic mask plate and the mask frame. As another example, it is also preferable to form a thin film suitable for adhering to the mask frame on a face to which the plastic mask plate is secured, to form a thin film suitable for adhering to the plastic mask plate on a face to which the mask frame is secured, and, then, to secure the mask frame and the plastic mask plate by an adhesive suitable for adhering to both the thin films.

Moreover, in the above-mentioned preferable methods for securing the plastic mask plate directly to the mask frame, the mask frame and the plastic mask plate can be tightly secured by providing a rough finish on the surfaces of either or both of the mask frame and the plastic mask plate, or by forming a relatively large number of fine holes in the surface of the plastic mask plate.

Furthermore, in the above-mentioned plastic mask unit fabricating method, it is preferable to form the plastic mask plate with a plurality of slit-shaped through-holes therein for serving as a print pattern for paste printing by excimer laser abrasion.

Other objects, features, and advantages of the present invention will become apparent from the following detailed description when read in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
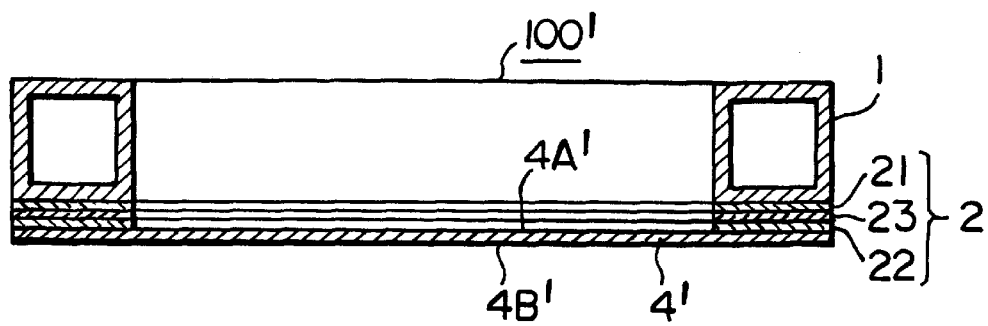
FIG. 1 is a sectional view of an example of a plastic mask unit for paste printing according to the present invention.

In describing preferred embodiments of the present invention illustrated in the drawings, specific terminology is employed for the sake of clarity. However, the present invention is not intended to be limited to the specific terminology so selected and it is to be understood that each specific element includes all technical equivalents which operate in a similar manner.

Referring now to the drawings, wherein like reference numerals designate identical or corresponding parts throughout the several views, and more particularly to FIG. 1 thereof, there is illustrated a sectional view of an example of a novel plastic mask unit 100' for paste printing including a mask frame 1 and a mask plate 4', made of a plastic sheet including a plurality of slit-shaped through-holes therein for serving as a print pattern for paste printing, for performing as a print mask, and wherein such a plastic mask plate 4' is secured directly to the mask frame 1. In this plastic mask unit 100', a thin film of an adhesive 2 is formed between the mask frame 1 and the plastic mask plate 4', by which the plastic mask plate 4' is secured directly to the mask frame 1 as shown in FIG. 1. Such an adhesive 2 has a three-layer structure including a first adhesive 21 adhering to a mask frame 1 side, a second adhesive 22 adhering to a plastic mask plate 4' side, and a third adhesive 23 securing the first adhesive 21 to the second adhesive 22. Accordingly, the mask frame 1 is secured to an upper surface 4A' of the plastic mask plate 4'. In addition, reference numeral 4B' in FIG. 1 denotes the bottom surface of the plastic mask plate 4'.

Next, processes for coating adhesives onto the mask frame 1 and a plastic mask plate 4 during fabrication of the plastic mask unit 100, which is expected to become the above-mentioned plastic mask unit 100', are explained with reference to FIG. 2. In this case, the plastic mask unit 100 represents a semifinished form of the plastic mask unit 100', since the plastic mask plate 4 is in a form expected to be formed with a plurality of through-holes therein for serving as a print pattern for paste printing. Accordingly, the plastic mask unit 100 becomes the plastic mask 100' when the plastic mask plate 4 is formed with a plurality of through-holes therein for serving as a print pattern for paste printing.

Figure 2:
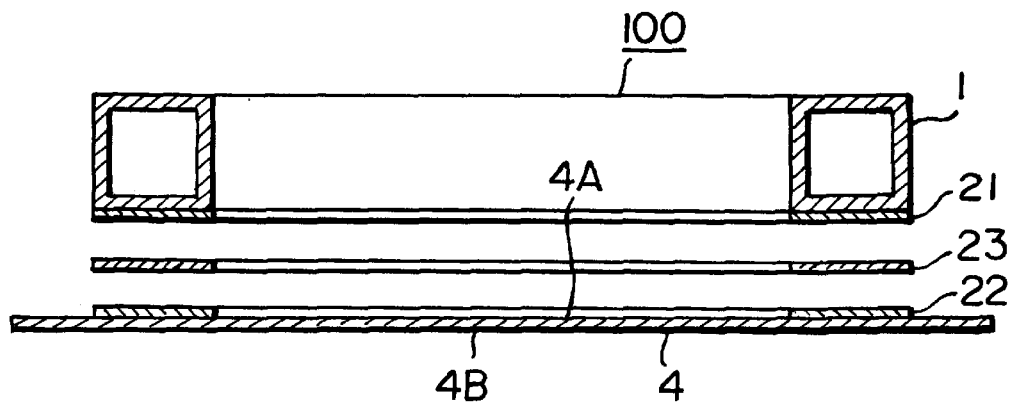
FIG. 2 is an exploded sectional view of the plastic mask unit shown in FIG. 1.

In the embodiment shown in FIG. 2, a rubber type adhesive is diluted with methylethylketone and coated onto a portion of the aluminum square pipe mask frame 1, on which the plastic mask plate 4 is placed, so as to form a thin film of the first adhesive 21 after the adhesive has dried. Also, a rubber type adhesive is diluted with methylethylketone and coated onto a portion of the plastic mask plate 4, on which the mask frame 1 is placed, so as to form a thin film of the second adhesive 22 after the adhesive has dried. Further, an epoxy type adhesive as the third adhesive is coated onto the surface of the thin film made of the first adhesive 21 secured to the mask frame 1 and the surface of the thin film made of the second adhesive 22 secured to the plastic mask plate 4.

Although, in the above-mentioned embodiment, the rubber type adhesive is used as an adhesive suitable for adhering to the aluminum square pipe mask frame 1 and the plastic mask plate 4 and the epoxy type adhesive is used as an adhesive suitable for adhering to the thin films made of the rubber type adhesive, other types of adhesives suitable for adhering the mask frame, the plastic mask plate, and thin films made of these adhesives, respectively, may be used.

Figure 3:
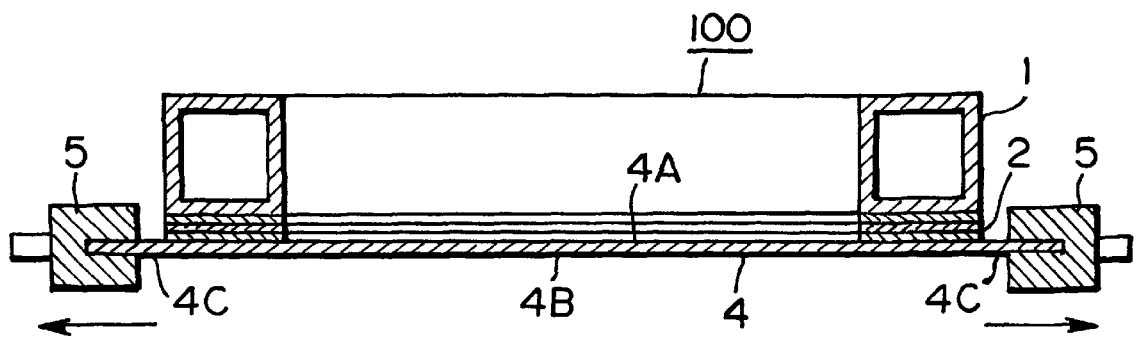
FIG. 3 is a sectional view of the plastic mask unit shown in FIG. 1 for showing how a mask plate is secured to a mask frame.

Next, a process of securing the plastic mask plate 4 to the mask frame 1 is explained with reference to FIG. 3. As shown in FIG. 3, each of the four sides of the plastic mask plate 4 is equally subjected to a predetermined tension along the whole length of each side by tension members 5 in the directions indicated by the arrows in FIG. 3 and in the forward and reverse directions along an axis perpendicular to the drawing. This application of the predetermined tension to the sides of the plastic mask plate 4 is carried out while the plastic mask plate 4 is being placed and secured to the mask frame 1. After the plastic mask plate 4 is secured to the mask frame 1, the adhesive 2 is subsequently formed into a film between these two elements. Only after the adhesive 2 is cured, the tension members 5 are removed from the plastic mask plate 4. Since, in addition to an extension made by the tension members 5, the plastic mask 4 is prepared in a predetermined size larger than that of the mask frame 1, there are overhanging edges 4C of the plastic mask plate 4 relative to the periphery of the mask frame 1. Accordingly, these excess edge sides 4C of the plastic mask plate 4 are cut off so that the plastic mask plate 4 becomes equal to the mask frame 1 in size in the horizontal plane on the drawing.

Figure 4:
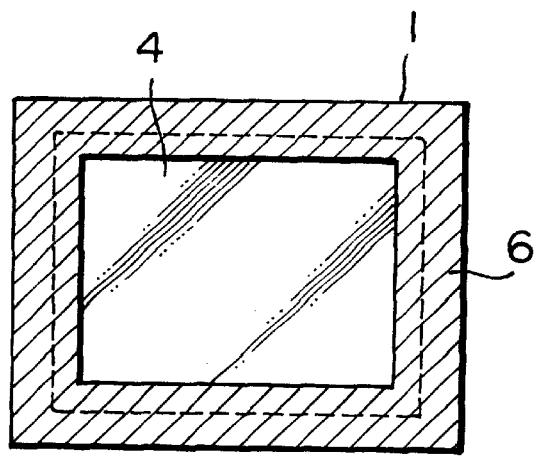
FIG. 4 is a top plan view of the plastic mask unit shown in FIG. 1 for showing the plastic mask unit taped with a protective tape for protecting peeling at an area where the mask plate is secured to a mask frame.
Figure 5:
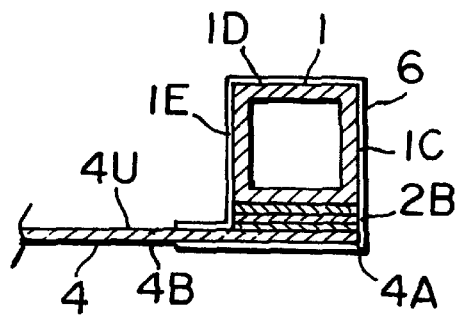
FIG. 5 is a sectional view of a part of the plastic mask unit shown in FIG. 1 for showing a method for placing the protective tape.

As shown in FIGS. 4 and 5, an area in which the plastic mask plate 4 is secured to the mask frame 1 may be protected from peeling by being taped with a protective tape 6. FIG. 4 shows a top plan view of the plastic mask unit 100 with the protective tape 6 in place, and FIG. 5 shows a sectional view of this. The placement of the protective tape 6 in FIGS. 4 and 5 may be made in the order of the bottom surface 4B for a length longer than the pipe width of the mask frame 1, an edge 4D of the plastic mask plate 4, an edge 2A of the adhesive 2, a side surface 1A of the mask frame 1, an upper surface 1B of the mask frame 1, an inner surface 1C of the mask frame 1, and the upper surface 4A of the plastic mask plate 4. Of course, the placement of the protective tape 6 may be made in the reverse order.

In the case where the adhesion strength of the adhesive 2 is relatively insufficient, it is preferable to provide a rough finish to the surfaces of the mask frame 1 and the mask plate 4 to which adhesion is made, during the process of applying adhesives. It is also preferable to provide a large number of fine holes in the surface of the mask plate 4.

Figure 6:
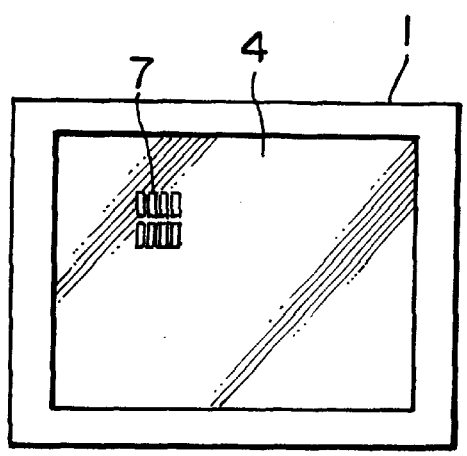
FIG. 6 is a top plan view of the plastic mask unit shown in FIG. 1 including through-holes therein for serving as a print pattern for paste printing.

After completing the placement of the protective tape in the above-mentioned manner, the plastic mask unit is subjected to irradiation by an excimer laser beam so that the plastic mask plate 4 thereof is formed with a plurality of slit-shaped through-holes 7 therein for serving as a print pattern for paste printing. Consequently, the fabrication procedure is ended and, as a result, there is fabricated one plastic mask unit 100' according to the present invention as shown in FIG. 6, which is equivalent to the one shown in FIG. 1.

Figure 7:
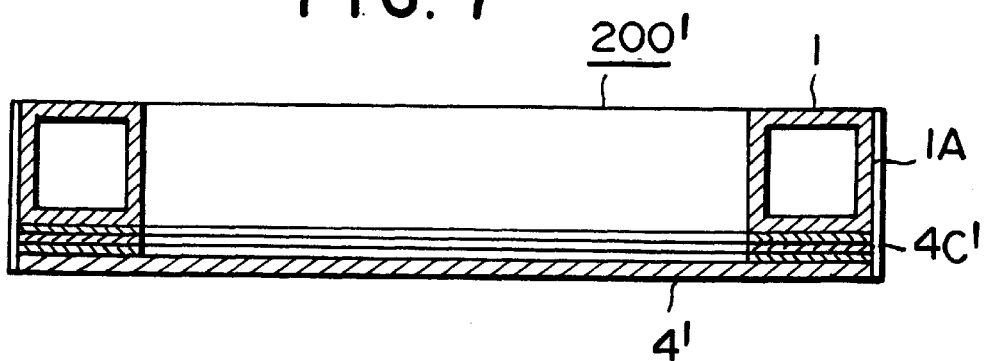
FIG. 7 is a sectional view of another example of a plastic mask unit for paste printing according to the present invention.
Figure 8:
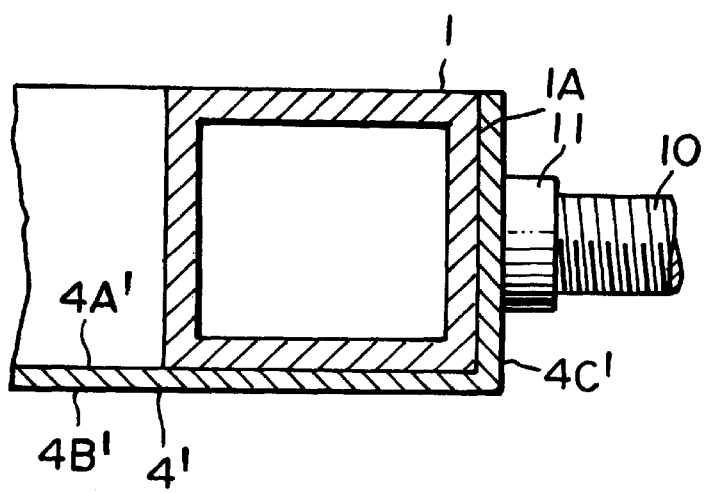
FIG. 8 is a sectional view of a part of the plastic mask unit shown in FIG. 7 for showing how the plastic mask unit is supported by clamps.
Figure 9:
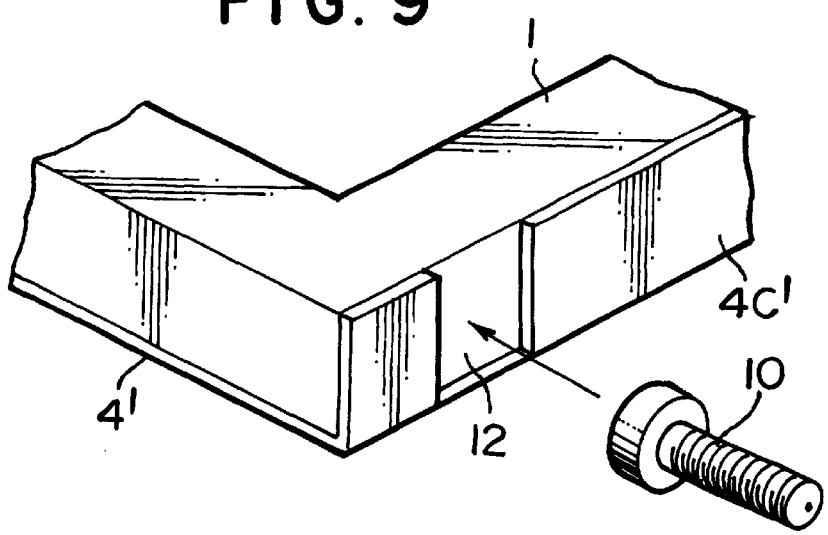
FIG. 9 is a perspective view of a part of another example of a plastic mask unit, including a clamped, for paste printing according to the present invention.
Figure 10A:
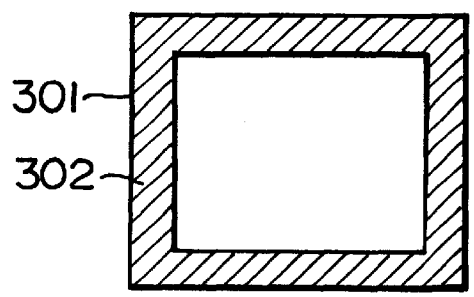
FIGS. 10(*a*)–19(*h*) are illustrations for showing a conventional fabrication procedure for a conventional mask unit for paste printing.
Figure 10B:
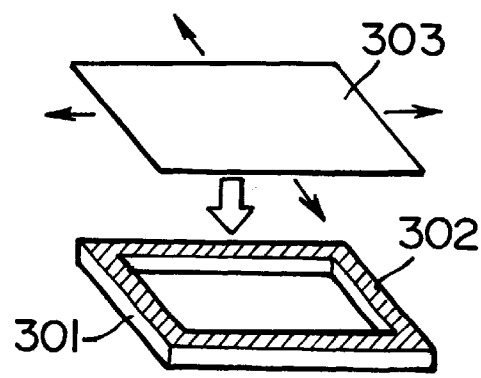
Figure 10C:
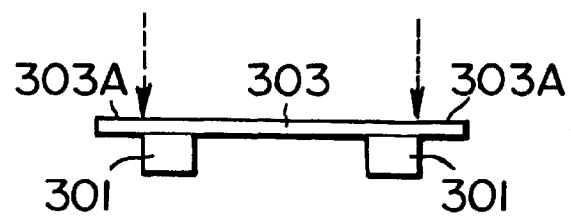
Figure 10D:
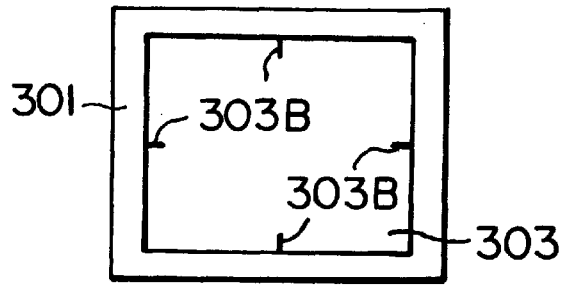
Figure 10E:
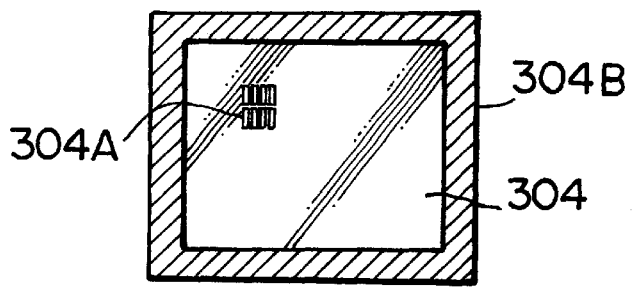
Figure 10F:
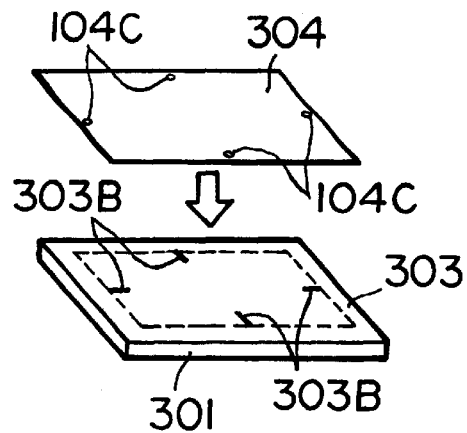
Figure 10G:
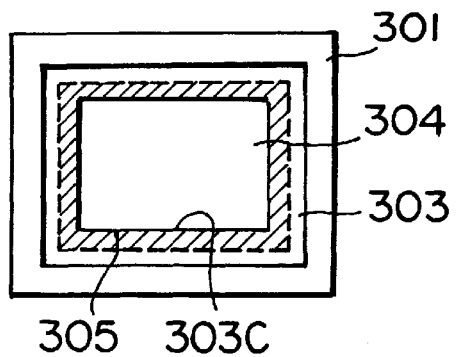
Figure 10H:
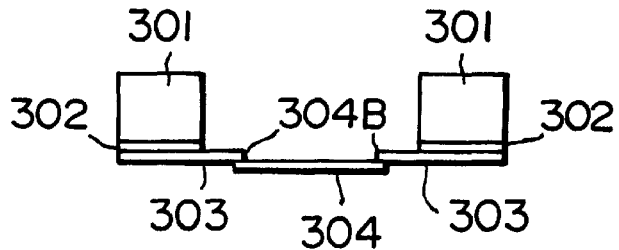

Next, another example of a plastic mask unit according to the present invention is explained with reference to FIGS. 7–9. A plastic mask unit 200' shown in FIG. 7 is fabricated in a manner similar to the plastic mask unit 100' shown in FIG. 1, except for a process in which an edge 4C' of a plastic mask plate 4' of the plastic mask unit 200' is bent so as to be secured to an outer side 1A of a mask frame 1, in order to protect the plastic mask plate 4' and the mask frame 1 from peeling. More specifically, the edge 4C' of the plastic mask plate 4' is bent along the outer side 1A of the mask frame 1, while being outwardly subjected to a predetermined tension by the tension members 5 described hereinbefore, so that the mask frame 1 and the plastic mask plate 4' are firmly secured. In the above-mentioned bending process, the bending may be made at two opposite edges 4C' of the plastic mask plate 4', although it is preferable to bend all four edges 4C' of the plastic mask plate 4'.

In general, a plastic mask unit is supported by clamps in a paste printing machine during an operation. When the above-mentioned plastic mask unit 200' is used in the paste printing machine, a clamp 10 shown in FIG. 8 must be attached in a way so as not to damage any part of the edges 4C' of the plastic mask plate 4'. This is because registration of the plastic mask unit 200' with respect to a printing material becomes inaccurate due to abrasion of the edges 4C' of the plastic mask plate 4' if a holding part 11 of each clamp 10 holds the plastic mask unit 200' by pressing the edges 4C' of the plastic mask plate 4' as shown in FIG. 8. In order to avoid this problem, the edges 4C' of the plastic mask plate 4' may be provided with a cut-out 12 as shown in FIG. 9. In this way, the edges 4C' of the plastic mask plate 4' are not abraded by contact with the clamps 10 and, therefore, registration of the plastic mask unit 200' with respect to the printing material is not made inaccurate because of the clamps 10.

Obviously, numerous additional modifications and variations of the present invention are possible in light of the above teachings. It is therefore to be understood that within the scope of the appended claims, the present invention may be practiced otherwise than as specifically described herein.

Japanese Patent Application No. 7-333185 filed Dec. 21, 1995 is hereby incorporated by reference.

What is claimed as new and is desired to be secured by Letters Patent of the United States is:

1. A plastic mask unit for paste printing, comprising:
   a mask frame; and
   a mask plate comprising a plastic sheet formed with a plurality of slit-shaped through-holes therein for serving as a print pattern for paste printing and secured directly to said mask frame with at least one adhesive,
   wherein said at least one adhesive comprises three adhesive layers, a first adhesive layer which is suitable for adhering to said mask frame and placed on a mask frame side, a third adhesive layer which is suitable for adhering to said mask plate and placed on a mask plate side, and a second adhesive layer which is suitable for adhering to said first and third layers and placed between said first and third layers.

2. The plastic mask unit for paste printing according to claim 1, wherein said plurality of slit-shaped through-holes are formed using an excimer laser.

3. A plastic mask unit for paste printing, comprising:
   a mask frame; and
   a mask plate comprising a plastic sheet formed with a plurality of slit-shaped through-holes therein for serving as a print pattern for paste printing and secured directly to said mask frame,
   wherein said mask frame is secured to a first adhesive thin film suitable for adhering to said mask frame, said mask plate is secured to a second adhesive thin film suitable for adhering to said mask plate, and said mask frame and said mask plate are secured together by an adhesive thin film suitable for adhering to said first and second adhesive thin films.

4. The plastic mask unit for paste printing according to claim 3, wherein said plurality of slit-shaped through-holes are formed using an excimer laser.

5. A plastic mask unit for paste printing, comprising:
   a mask frame; and
   a mask plate comprising a plastic sheet formed with a plurality of slit-shaped through-holes therein for serving as a print pattern for paste printing and secured directly to said mask frame with at least one adhesive,
   wherein said at least one adhesive includes three adhesive thin films and said mask frame is secured to a first adhesive thin film suitable for adhering to said mask frame, said mask plate is secured to a second adhesive thin film suitable for adhering to said mask plate, and said mask frame and said mask plate are secured together by an adhesive thin film suitable for adhering to said first and second adhesive thin films.

6. A method of fabricating a plastic mask unit for paste printing which comprises a mask frame and a mask plate comprising a plastic sheet, comprising steps of:
   forming said mask plate with a plurality of slit-shaped through-holes for serving as a print pattern for paste printing; and
   securing the peripheral portion of said mask plate directly to said mask frame so as to align the central portion with the central opening,
   wherein said step of securing said mask plate comprises steps of:
   coating a first adhesive suitable for adhering to said mask frame onto a surface of said mask frame;
   coating a second adhesive suitable for adhering to said mask plate onto a surface of said mask plate; and
   then securing said mask plate directly to said mask frame by a third adhesive suitable for adhering to said first and second adhesives.

7. The method of fabricating a plastic mask unit for paste printing according to claim 6, wherein said step of securing said mask plate directly to said mask frame comprises steps of:
   securing said mask frame to a first adhesive thin film suitable for adhering to said mask frame;
   securing said mask plate to a second adhesive thin film suitable for adhering to said mask plate; and
   then securing said mask plate directly to said mask frame with an adhesive suitable for adhering to said first and second adhesive thin films.

8. The method of fabricating a plastic mask for paste printing according to claim 6, wherein said step of forming said mask plate is carried out by using an excimer laser.

9. The method of fabricating a plastic mask for paste printing according to claim 7, wherein said step of forming said mask plate is carried out by using an excimer laser.

10. A method of fabricating a plastic mask unit for paste printing which comprises a mask frame and a mask plate comprising a plastic sheet, comprising steps of:
    forming said mask plate with a plurality of slit-shaped through-holes for serving as a print pattern for paste printing; and
    securing said mask plate directly to said mask frame,
    wherein said step of securing said mask plate comprises steps of:
    securing said mask frame to a first adhesive thin film suitable for adhering to said mask frame;
    securing said mask plate to a second adhesive thin film suitable for adhering to said mask plate; and
    then securing said mask plate directly to said mask frame with an adhesive suitable for adhering to said first and second adhesive thin films.

11. The method of fabricating a plastic mask for paste printing according to claim 10, wherein said step of forming said mask plate is carried out by using an excimer laser.

12. A method of fabricating a plastic mask unit for paste printing which comprises a mask frame and a mask plate comprising a plastic sheet, comprising steps of:
    securing said mask plate directly to said mask frame; and
    forming said mask plate with a plurality of slit-shaped through-holes for serving as a print pattern for paste printing,
    wherein said step of securing said mask plate comprises steps of:
    coating a first adhesive suitable for adhering to said mask frame onto a surface of said mask frame;
    coating a second adhesive suitable for adhering to said mask plate onto a surface of said mask plate; and
    then securing said mask plate directly to said mask frame by a third adhesive suitable for adhering to said first and second adhesives.

13. The method of fabricating a plastic mask unit for paste printing according to claim 12, wherein said step of securing said peripheral portion of the mask plate directly to said mask frame comprises steps of:
   securing said mask frame to a first adhesive thin film suitable for adhering to said mask frame;
   securing said mask plate to a second adhesive thin film suitable for adhering to said mask plate; and
   then securing said mask plate directly to said mask frame with an adhesive suitable for adhering to said first and second adhesive thin films.

14. The method of fabricating a plastic mask for paste printing according to claim 12, wherein said step of forming said mask plate is carried out by using an excimer laser.

15. The method of fabricating a plastic mask for paste printing according to claim 13, wherein said step of forming said mask plate is carried out by using an excimer laser.

16. A method of fabricating a plastic mask unit for paste printing which comprises a mask frame and a mask plate comprising a plastic sheet, comprising steps of:
   securing said mask plate directly to said mask frame; and
   forming said mask plate with a plurality of slit-shaped through-holes for serving as a print pattern for paste printing,
   wherein said step of securing said mask plate comprises steps of:
   securing said mask frame to a first adhesive thin film suitable for adhering to said mask frame;
   securing said mask plate to a second adhesive thin film suitable for adhering to said mask plate; and
   then securing the peripheral portion of said mask plate directly to said mask frame with an adhesive suitable for adhering to said first and second adhesive thin films.

17. The method of fabricating a plastic mask for paste printing according to claim 16, wherein said step of forming said mask plate is carried out by using an excimer laser.

18. A plastic mask unit for paste printing, comprising:
   a mask frame; and
   a mask plate comprising a plastic sheet formed with no through-holes therein and secured directly to said mask frame with at least one adhesive,
   wherein said at least one adhesive comprises three adhesive layers, a first adhesive layer which is suitable for adhering to said mask frame and placed on a mask frame side, a third adhesive layer which is suitable for adhering to said mask plate and placed on a mask plate side, and a second adhesive layer which is suitable for adhering to said first and third layers and placed between said first and third layers.

19. The plastic mask unit for paste printing according to claim 18, wherein said mask frame is secured to a first adhesive thin film suitable for adhering to said mask frame, said mask plate is secured to a second adhesive thin film suitable for adhering to said mask plate, and said mask frame and said mask plate are secured together by an adhesive suitable for adhering to said first and second adhesive thin films.

20. A plastic mask unit for paste printing, comprising:
   a mask frame; and
   a mask plate comprising a plastic sheet formed with no through-holes therein and secured directly to said mask frame with at least one adhesive,
   wherein said at least one adhesive includes three adhesive thin films and said mask frame is secured to a first adhesive thin film suitable for adhering to said mask frame, said mask plate is secured to a second adhesive thin film suitable for adhering to said mask plate, and said mask frame and said mask plate are secured together by an adhesive thin film suitable for adhering to said first and second adhesive thin films.

* * * * *